US009588433B2

(12) United States Patent
Saenger

(10) Patent No.: US 9,588,433 B2
(45) Date of Patent: Mar. 7, 2017

(54) OPTICAL SYSTEM, IN PARTICULAR OF A MICROLITHOGRAPHIC PROJECTION EXPOSURE APPARATUS

(71) Applicant: Carl Zeiss SMT GmbH, Oberkochen (DE)

(72) Inventor: Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 151 days.

(21) Appl. No.: 14/501,770

(22) Filed: Sep. 30, 2014

(65) Prior Publication Data

US 2015/0062551 A1    Mar. 5, 2015

Related U.S. Application Data

(63) Continuation of application No. PCT/EP2013/057329, filed on Apr. 8, 2013.
(Continued)

(30) Foreign Application Priority Data

Apr. 17, 2012   (DE) .................. 10 2012 206 287

(51) Int. Cl.
*G03F 7/20* (2006.01)
*G02B 5/30* (2006.01)
*G02B 27/28* (2006.01)

(52) U.S. Cl.
CPC ....... *G03F 7/70191* (2013.01); *G02B 5/3075* (2013.01); *G02B 5/3083* (2013.01);
(Continued)

(58) Field of Classification Search
CPC . G02B 27/286; G02B 5/3083; G03F 7/70191; G03F 7/70566; G03F 7/70966
See application file for complete search history.

(56) References Cited

U.S. PATENT DOCUMENTS

2004/0036961 A1    2/2004   McGuire
2004/0036971 A1    2/2004   McGuire
(Continued)

FOREIGN PATENT DOCUMENTS

CA          2 521 203        3/2006
DE    10 2009 055 184 B4     6/2011
(Continued)

OTHER PUBLICATIONS

Beresna, M. et al.: "Radially polarized optical vortex converter created by femtosecond laser nanostructuring of glass", Applied Physics Letter vol. 98, pp. 201101-1 to 201101-3 (2011).
(Continued)

*Primary Examiner* — Michelle M Iacoletti
(74) *Attorney, Agent, or Firm* — Fish & Richardson P.C.

(57) ABSTRACT

The invention relates to an optical system, in particular of a microlithographic projection exposure apparatus, with an optical system axis (OA) and a polarization-influencing optical arrangement. According to one aspect, the polarization-influencing optical arrangement comprises at least one polarization-influencing optical element, which has a monolithic design and linear birefringence, wherein the overall absolute value of the birefringence of all of the polarization-influencing optical elements deviates by at most ±15% from the value lambda/2, wherein lambda is the working wavelength of the optical system, wherein the direction of the fast axis of this birefringence varies in a plane perpendicular to the optical system axis (OA) in the at least one polarization-influencing optical element, and wherein the distribution of the fast axis of the birefringence of the polarization-influencing optical element is brought about by radiation-induced defects, which are situated in at least one optically unused region of the element.

21 Claims, 5 Drawing Sheets

Related U.S. Application Data

(60) Provisional application No. 61/625,171, filed on Apr. 17, 2012.

(52) U.S. Cl.
CPC ....... *G02B 27/286* (2013.01); *G03F 7/70566* (2013.01); *G03F 7/70966* (2013.01)

(56) References Cited

U.S. PATENT DOCUMENTS

| | | |
|---|---|---|
| 2004/0223212 A1 | 11/2004 | Sakuma |
| 2005/0146704 A1 | 7/2005 | Gruner et al. |
| 2006/0055909 A1 | 3/2006 | Fiolka et al. |
| 2006/0067618 A1 | 3/2006 | Hill |
| 2006/0221453 A1 | 10/2006 | Koehler et al. |
| 2007/0115551 A1 | 5/2007 | Spilman et al. |
| 2009/0040496 A1 | 2/2009 | Gruner et al. |
| 2009/0237909 A1 | 9/2009 | Ogawa |
| 2011/0069296 A1 | 3/2011 | Gruner et al. |
| 2011/0149261 A1 | 6/2011 | Saenger et al. |
| 2014/0285788 A1 | 9/2014 | Saenger et al. |
| 2014/0347646 A1 | 11/2014 | Dmitriev et al. |
| 2015/0017589 A1 | 1/2015 | Saenger et al. |

FOREIGN PATENT DOCUMENTS

| | | |
|---|---|---|
| DE | 10 2012 206 159 | 6/2013 |
| EP | 1 668 420 | 6/2006 |
| EP | 1 720 199 B1 | 12/2011 |
| JP | 2005-535939 | 11/2005 |
| JP | 2007-506262 | 3/2007 |
| JP | 2007-515768 | 6/2007 |
| JP | 2015-509285 | 3/2015 |
| JP | 2015-509662 | 3/2015 |
| JP | 2015-513223 | 4/2015 |
| WO | WO 03/054590 | 7/2003 |
| WO | WO 03/077011 A1 | 9/2003 |
| WO | WO 2004/019077 | 3/2004 |
| WO | WO 2005/026822 | 3/2005 |
| WO | WO 2005/026843 A2 | 3/2005 |
| WO | WO 2005/031467 | 4/2005 |
| WO | WO 2005/069081 A2 | 7/2005 |
| WO | WO 2013/104477 | 7/2013 |
| WO | WO 2013/123973 A1 | 8/2013 |
| WO | WO 2013/143594 A1 | 10/2013 |
| WO | WO 2013/143803 A1 | 10/2013 |

OTHER PUBLICATIONS

Sudrie, L. et al.: "Study of damage in fused silica induced by ultra-short IR laser pulses", Optics Communications vol. 191, pp. 333-339 (2001).

German Office Action, with translation thereof, for DE Appl No. 10 2012 206 287.4, dated Dec. 12, 2012.

International Search Report and Written Opinion for corresponding PCT Appl No. PCT/EP2013/057329, dated Aug. 30, 2013.

International Preliminary Report on Patentability for corresponding PCT Appl No. PCT/EP2013/057329, dated Oct. 30, 2014.

Japanese Office Action, with English translation thereof for JP Appl. No. 2015-506176, dated Nov. 4, 2016, 17 pages.

OPTICAL SYSTEM, IN PARTICULAR OF A MICROLITHOGRAPHIC PROJECTION EXPOSURE APPARATUS

CROSS REFERENCE TO RELATED APPLICATIONS

The present application is a continuation of, and claims benefit under 35 USC 120 to, international application PCT/EP2013/057329, filed Apr. 8, 2013, which claims priority of German Patent Application DE 10 2012 206 287.4 and U.S. 61/625,171, both filed on Apr. 17, 2012. The contents of each of these applications is incorporated by reference herein.

BACKGROUND OF THE INVENTION

Field of the Invention

The invention relates to an optical system, in particular of a microlithographic projection exposure apparatus. In particular, the invention relates to an optical system with a polarization-influencing optical arrangement, which is suitable for use in an illumination device or in a projection lens of a microlithographic projection exposure apparatus and which renders possible flexible setting of different polarization distributions, including a mixed tangential/radial polarization distribution.

Prior Art

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

It is established practice to set a tangential polarization distribution in particular in both the illumination device and in the projection lens for the purposes of high-contrast imaging. A "tangential polarization" (or "TE polarization") is understood to mean a polarization distribution in which the oscillation planes of the electric field strength vectors of the individual linearly polarized light rays are oriented approximately perpendicular to the radius directed at the optical system axis. By contrast, a "radial polarization" (or "TM polarization") is understood to mean a polarization distribution in which the oscillation planes of the electric field strength vectors of the individual linearly polarized light rays are oriented approximately radially to the optical system axis. Accordingly, a quasi-tangential or a quasi-radial polarization distribution is understood to mean a polarization distribution in which the aforementioned criteria are at least approximately satisfied.

Moreover, there is also a need for setting further polarization distributions which vary over the pupil of the illumination device.

In respect of the prior art, reference is made in a purely exemplary fashion to WO 2005/069081 A2, US 2006/0055909 A1, WO 03/077011 A1 and DE 10 2009 055 184 B4.

SUMMARY OF THE INVENTION

It is an object of the present invention to provide an optical system, in particular of a microlithographic projection exposure apparatus, which system enables the provision of a desired polarization distribution (such as, for example, a tangential polarization distribution) with comparatively little manufacturing complexity and with high accuracy.

This object is achieved in accordance with the features of the independent claims.

In accordance with one aspect of the invention, an optical system, in particular of a microlithographic projection exposure apparatus, comprises an optical system axis and a polarization-influencing optical arrangement, wherein this polarization-influencing optical arrangement comprises:

at least one polarization-influencing optical element, which has a monolithic design and linear birefringence, wherein the overall absolute value of the birefringence of all of the polarization-influencing optical elements deviates by at most ±15% from the value lambda/2, wherein lambda is the working wavelength of the optical system;

wherein the direction of the fast axis of this birefringence varies in a plane perpendicular to the optical system axis in the at least one polarization-influencing optical element; and wherein the distribution of the fast axis of the birefringence of the polarization-influencing optical element is brought about by radiation-induced defects, which are situated in at least one optically unused region of the element.

In particular, the concept underlying the present invention is that of generating a desired (output) polarization distribution via at least one optical element with a monolithic design and spatially varying direction of the fast axis of the birefringence, wherein this birefringence effect or the brought-about retardation overall, in terms of absolute value, substantially equals lambda/2, wherein use is made of the effect of mirroring the polarization direction on the fast axis of the birefringence, which occurs in a lambda/2 plate. According to the invention, it is firstly possible here to avoid segment interspaces as a result of generating the varying direction of the fast axis of the birefringence in a monolithic element. Moreover, it is also possible to dispense with the generation of varying thickness profiles and, accompanying this in certain circumstances, manufacturing complexity since the polarization-influencing effect precisely does not depend on a variation in the thickness of the material through which light passes but rather on the spatial variation of the fast axis of the birefringence.

The local variation of the fast axis of the birefringence, according to the invention, can moreover—as will be explained in more detail below—be set with comparatively high accuracy, and so the generation of the desired (output) polarization distribution is also possible with relatively high accuracy. A further advantage of the aforementioned approach according to the invention is that, if required, "post-processing" of the polarization-influencing optical element for the purpose of modifying the polarization-influencing effect can be carried out comparatively simply, for example relative to changing the thickness profile. Here a suitable polarimetry design can be used in a manner known per se to measure the whole birefringence of the polarization-influencing optical arrangement and there can thereupon be suitable post-processing of the at least one polarization-influencing optical element for the purpose of modifying the local variation of the fast axis of the birefringence.

In accordance with one embodiment, the overall absolute value of the birefringence of all of the polarization-influencing optical elements deviates by at most ±10%, in particular by at most ±5%, furthermore in particular by at most ±3%, from the value lambda/2. The wording "the overall absolute value of the birefringence of all of the polarization-influencing optical elements" is to be understood as the summed up (added up) birefringence of all of the polarization-influencing optical elements.

In accordance with one embodiment, during the operation of the optical system, the polarization-influencing optical arrangement converts a constant linear input polarization distribution of light incident on the arrangement into an at least approximately tangential, an at least approximately radial or a mixed radial/tangential output polarization distribution.

Here and in the following text, a "mixed tangential/radial polarization distribution" (which can also be referred to as TE/TM polarization distribution or TM/TE polarization distribution) should be understood to mean a polarization distribution which has a (continuous or step-by-step) transition between a tangential and a radial polarization distribution. In other words, such a polarization distribution, in the transition between points in the pupil at which the oscillation planes of the electric field strength vectors of the individual linearly polarized light rays are oriented approximately perpendicular to the radius directed at the optical system axis and points at which the oscillation planes of the electric field strength vectors of the individual linearly polarized light rays are oriented approximately parallel to the radius directed at the optical system axis, has points at which the oscillation planes of the electric field strength vectors lie between these two "extreme" positions and undergo continuous or step-by-step transition from the tangential to the radial alignment over the pupil.

In accordance with a further aspect, the invention also relates to an optical system, in particular of a microlithographic projection exposure apparatus, with an optical system axis and a polarization-influencing optical arrangement, wherein this polarization-influencing optical arrangement comprises:

at least one polarization-influencing optical element, which has a monolithic design and linear birefringence, wherein the direction of the fast axis of this birefringence varies in a plane perpendicular to the optical system axis;

wherein, during the operation of the optical system, the polarization-influencing optical element converts a constant linear input polarization distribution of light incident on the arrangement into an at least approximately tangential, an at least approximately radial or a mixed radial/tangential output polarization distribution; and wherein the distribution of the fast axis of the birefringence of the polarization-influencing optical element is brought about by radiation-induced defects, which are situated in at least one optically unused region of the element.

The generation of the local variation of the fast axis of the birefringence, used according to the invention, via radiation-induced defects is based on the discovery that, by irradiating an amorphous material such as e.g. quartz glass ($SiO_2$) with infrared radiation in particular, a linear birefringence, caused by the radiation-induced defects, can be created in the material in a targeted fashion, which birefringence also forms in the regions which are not directly irradiated such that the radiation-induced defects can also be generated in a region which is not used optically at all. However, in this respect, the disclosure is not restricted to the generation of radiation-induced defects in an optically unused region. Rather, it is also possible to irradiate or provide with defects those regions of the optical element through which, during operation of the optical system, light by all means passes through, for example if the polarization state or the manipulation thereof by the radiation-induced defects in the relevant regions is comparatively unimportant to the performance of the optical system, which, for example, is generally fulfilled for a central region with respect to the optical system axis in a microlithographic projection exposure apparatus.

Via the approach described above, the local variation of the fast axis of the birefringence, according to the invention, for generating a desired output polarization distribution can be set with a particularly high accuracy.

In accordance with a further aspect, the invention also relates to an optical system, in particular of a microlithographic projection exposure apparatus, with an optical system axis and a polarization-influencing optical arrangement, wherein this polarization-influencing optical arrangement comprises:

at least one polarization-influencing optical element, which has a monolithic design and linear birefringence, wherein the absolute value of this birefringence deviates by at most ±15% from a predetermined constant value and wherein the direction of the fast axis of this birefringence varies in a plane perpendicular to the optical system axis in the at least one polarization-influencing optical element; and wherein the distribution of the fast axis of the birefringence of the polarization-influencing optical element is brought about by radiation-induced defects, which are situated in at least one optically unused region of the element.

In accordance with one embodiment, the optically unused region of the element, in which the radiation-induced defects are generated, has an annular geometry.

In accordance with one embodiment, the distribution of the fast axis of the birefringence of the polarization-influencing optical element is brought about by radiation-induced defects, which are situated in a first radially inner region with respect to the optical system axis and in a second radially outer region with respect to the optical system axis. As a result of this, use is made of the discovery already mentioned above that, in a microlithographic projection exposure apparatus, the polarization state of the light passing through is generally comparatively unimportant or at least of little relevance for a central region with respect to the optical system axis, and so the radiation-inducing defects can be created not only in the optically unused regions (e.g. radially outer regions with respect to the optical system axis) but, as it were, also in a radially inner and, depending on the illumination setting, by all means optically used region. In the process, it is moreover optionally also possible, in an advantageous fashion, to achieve even more precise setting of the spatial distribution of the fast axis of the birefringence since the aforementioned birefringence distribution can, as it were, be generated from two sides (radially on the inside and radially on the outside with respect to the optical active surface).

In accordance with one embodiment, the polarization-influencing optical element has a plane-parallel geometry. Such an embodiment is particularly advantageous both from a manufacturing point of view and also in view of the achieved accuracy of the polarization-optical effect over the light beam cross section and, in particular, makes use of the principle, explained at the outset and utilized according to the invention, according to which a varying thickness profile for generating a desired output polarization distribution can be dispensed with.

In accordance with one embodiment, the polarization-influencing optical element is made of an amorphous material, in particular quartz glass ($SiO_2$).

In accordance with one embodiment, the optical system furthermore comprises a lambda/4 plate upstream of the polarization-influencing optical arrangement in the light propagation direction. By using such a lambda/4 plate, it is initially possible to convert light with an originally constant linear input polarization distribution in the optical system (as is, for example, provided by a laser light source) into circularly polarized light. As a result of this, it is in turn made possible—as will still be explained in more detail below—to design the at least one polarization-influencing optical element having the local distribution of the fast axis of the birefringence, for example in conjunction with a "downstream" (i.e. following the polarization-influencing optical arrangement) 45° rotator, in such a way that this local distribution is a radial or tangential distribution. This in turn renders it possible to generate the relevant birefringence by application of external (acting in the radial direction with respect to the optical system axis) pressure, which can, for example, be applied by piezoelectric elements.

In accordance with one embodiment, the optical system therefore furthermore comprises a 45° rotator downstream of the polarization-influencing optical arrangement in the light propagation direction, which 45° rotator brings about a rotation of the polarization direction of incident light about a polarization rotation angle of 45°.

In accordance with one embodiment, the optical system furthermore comprises a 90° rotator which brings about a rotation of the polarization direction of incident light about a polarization rotation angle of 90°. The presence of such a 90° rotator can be advantageous, particularly in view of the fact that an effect of retardation compensation, which goes beyond the setting according to the invention of a desired polarization state, can be obtained via suitable positioning of the 90° rotator: since an undesirable polarization ellipticity, which is present in the optical system and was generated or collected in the ("first") part of the optical system upstream of the 90° rotator in respect of the light propagation direction, is reversed by the action of the 90° rotator (i.e. from right-circular elliptical to left-circular elliptical or vice versa), it is possible to obtain an at least partial compensation of an undesired system retardation by the polarization ellipticity generated or collected in the ("second") part of the system downstream of the 90° rotator in respect of the light propagation direction and an at least partial compensation of an unwanted system retardation can be brought about.

Hence, in accordance with one embodiment, a system retardation created in the optical system upstream of the 90° rotator in respect of the light propagation direction is at least partly compensated by a system retardation generated in the optical system downstream of the 90° rotator in respect of the light propagation direction.

In accordance with one embodiment, the polarization-influencing optical arrangement comprises a plurality of polarization-influencing optical elements designed according to the invention, which are arranged in succession in the light propagation direction. In particular, these elements can be arranged directly in succession.

In accordance with one embodiment, at least one of these polarization-influencing optical elements is respectively arranged both upstream of the 90° rotator in the light propagation direction and downstream of the 90° rotator in the light propagation direction. In this embodiment, it is possible, if necessary, just to compensate the birefringence of the polarization-influencing optical elements arranged upstream of the 90° rotator in the light propagation direction by the birefringence of the polarization-influencing optical elements arranged downstream of the 90° rotator in the light propagation direction, as explained above.

In accordance with one embodiment, the optical system furthermore comprises an actuator device, via which at least one of the elements: lambda/4 plate, 45° rotator and 90° rotator, in particular all of these elements, can be moved independently of one another between a position within the optical beam path and a position outside of the optical beam path. This renders it possible, if necessary, also to obtain a switch in the generated output polarization distribution (e.g. from a tangential polarization distribution to a constant linear polarization distribution).

The invention furthermore relates to a microlithographic projection exposure apparatus and a method for microlithographic production of microstructured components.

Further embodiments of the invention can be gathered from the description and the dependent claims. The invention will be explained in more detail below on the basis of exemplary embodiments illustrated in the attached figures.

BRIEF DESCRIPTION OF THE DRAWINGS

In detail.

DETAILED DESCRIPTION OF PREFERRED EMBODIMENTS

Figure 1:
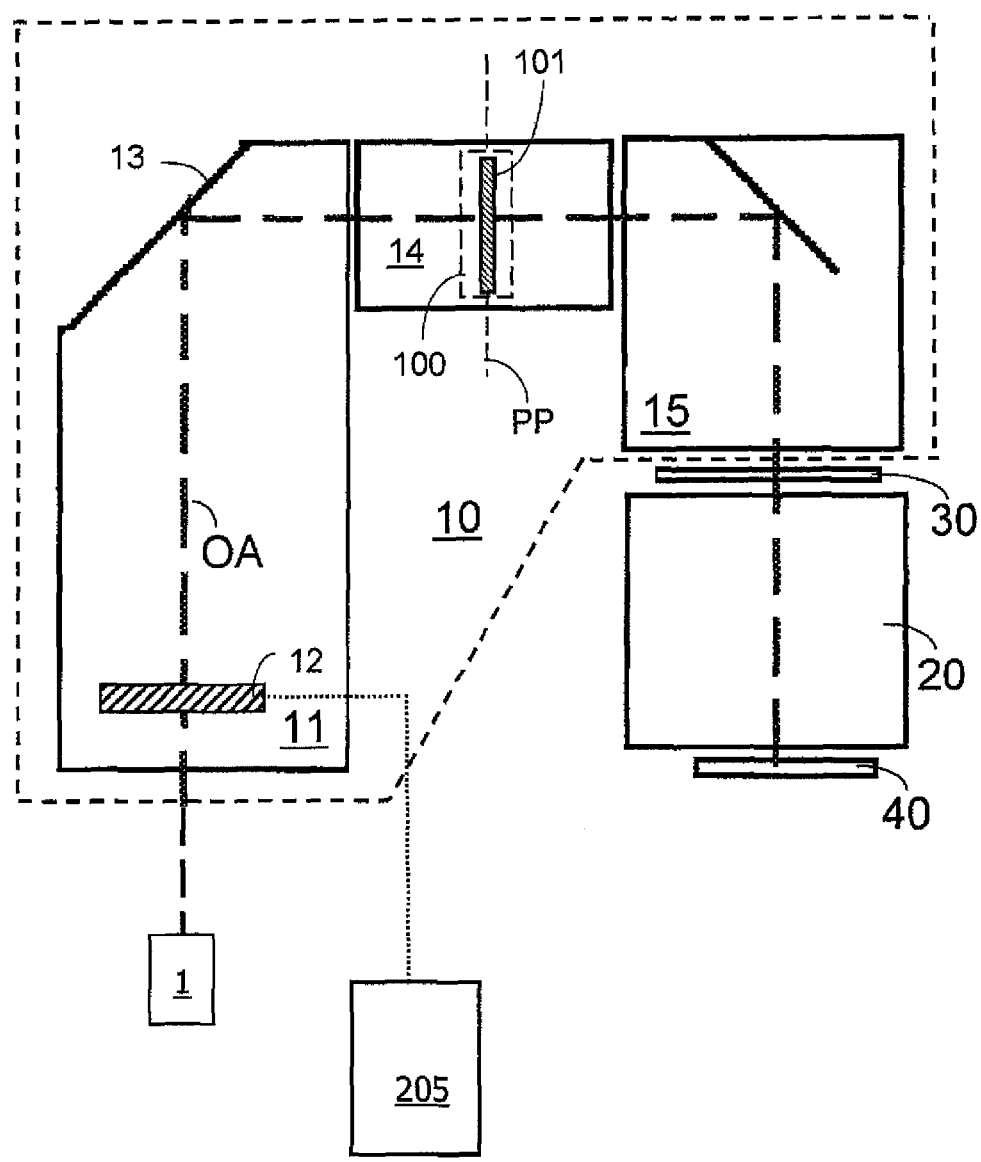
FIG. 1 shows a schematic illustration for explaining the design of a microlithographic projection exposure apparatus with a polarization-influencing optical arrangement in accordance with an embodiment of the invention.

In the following text, an exemplary embodiment of a microlithographic projection exposure apparatus with an optical system according to the invention is first of all explained with reference to FIG. 1. The projection exposure apparatus comprises an illumination device 10 and a projection lens 20. The illumination device 10 serves for illuminating a structure-bearing mask (reticle) 30 with light from a light source unit 1, which for example comprises an ArF excimer laser for a working wavelength of 193 nm and a beam shaping optical unit which produces a parallel light beam. In general, the illumination device 10 and the projection lens 20 are preferably designed for a working wavelength of less than 400 nm, in particular of less than 250 nm, furthermore in particular of less than 200 nm.

The illumination device 10 has an optical unit 11, which, inter alia, comprises a deflection mirror 13 in the illustrated example. In embodiments of the invention, the illumination device can, for generating different illumination configurations, comprise a mirror arrangement 12 as indicated in FIG. 1, which mirror arrangement comprises multiplicity of mirror elements which can be set independently of one another and as known from e.g. WO 2005/026843 A2. These mirror elements can respectively be tilted individually, e.g. in an angular range of −2° to +2°, more particularly of −5° to +5°, furthermore in particular of −10° to +10°. As a result of a suitable tilting arrangement of the mirror elements in the mirror arrangement, a desired light distribution, e.g. an annular illumination setting or else a dipole setting or quadrupole setting, can be formed in a pupil plane PP by virtue of the previously homogenized and collimated laser light being respectively deflected in the appropriate direction by the mirror elements, depending on the desired illumination setting. In further embodiments, the illumination device can, instead of the mirror arrangement, also comprise a divergence-increasing optical element such as e.g. a DOE and a zoom lens in conjunction with an axicon.

In the light propagation direction downstream of the optical unit 11, there are situated in the beam path a light mixing device (not illustrated), which can comprise in a manner known per se, for example, an arrangement of micro-optical elements that is suitable for achieving light mixing, and a lens element group 14, downstream of which is situated a field plane with a reticle masking system (REMA), which is imaged, by a REMA lens 15 disposed downstream in the light propagation direction, onto the structure-bearing mask (reticle) 30, which is arranged in a further field plane, and thereby delimits the illuminated region on the reticle. The structure-bearing mask 30 is imaged by the projection lens 20 onto a substrate 40, or a wafer, provided with a light-sensitive layer. In particular, the projection lens 20 can be designed for immersion operation. Furthermore, it can have a numerical aperture NA of greater than 0.85, in particular greater than 1.1.

In accordance with the invention, a polarization-influencing optical arrangement 100 is a component of the illumination device 10, which polarization-influencing optical arrangement has at least one polarization-influencing optical element 101, which, in the exemplary embodiment of FIG. 1, is situated in the pupil plane PP, or in the direct vicinity thereof, and which will be explained in more detail below with reference to FIG. 2ff.

Figure 2:
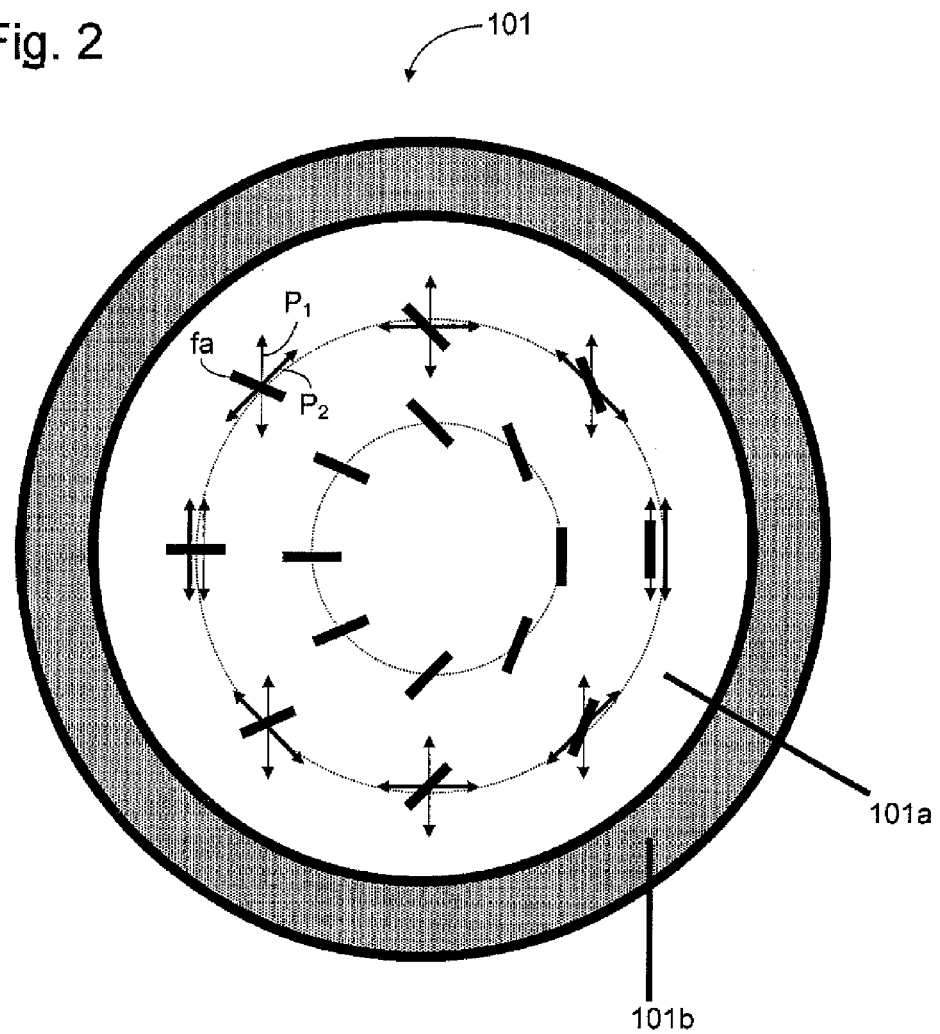
FIG. 2 shows a schematic illustration for explaining design and functionality of a polarization-influencing optical element in accordance with one embodiment of the invention.

FIG. 2 shows a schematic illustration for explaining design and functionality of a polarization-influencing optical element 101. The element 101 consists of an amorphous material such as e.g. quartz glass ($SiO_2$) and, as indicated schematically in FIG. 2, has linear birefringence as a result of a suitable treatment which will be explained in more detail below, the birefringence being substantially constant in terms of absolute value over a region 301a corresponding to the optical active area and varying locally in respect of the alignment of the fast axis of the birefringence over this optical active area. In FIG. 2, the respective position of the fast axis is symbolized by the lines of greatest thickness and denoted by "fa". The double-headed arrows with less thickness (denoted by "$P_1$") specify the direction of the input polarization, which, in the illustrated example, extends along the y-axis in the plotted coordinate system, and the double-headed arrows with medium thickness (denoted by $P_2$) specify the direction of the output polarization.

As can be seen from FIG. 2, the direction of the output polarization varies as a result of the local variation of the direction of the fast axis of the birefringence, wherein the polarization direction of the light emerging from the element 101 emerges as a mirroring of the input polarization direction on the fast axis "fa" for the case where the absolute value of the birefringence of the element 101 or of the retardation caused in the element equals lambda/2 (wherein lambda denotes the working wavelength).

In the specific exemplary embodiment of FIG. 2, the local variation of the fast axis of the birefringence in the element 101 is generated in precisely such a way that the output polarization distribution corresponds to a tangential polarization distribution. However, the invention is not restricted thereto, with, in further embodiments, it also being possible to generate e.g. a radial output polarization distribution or a mixed tangential/radial output polarization distribution— depending on the specific application or depending on the requirements in the optical system.

In FIG. 2, "101b" denotes an optically unused region, which, in the specific exemplary embodiment, has an annular geometry and in which radiation-induced defects are generated by infrared radiation for the purpose of generating the above-described linear birefringence with local variation of the fast axis in the amorphous material of the element 101. Here, the invention proceeds from the discovery that generating radiation-induced defects in a manner locally restricted to a predetermined region (the region 101b in the example) leads to a linear birefringence also being brought about in another region (in the region 101a in the example) of the relevant element 101, wherein the local distribution of the fast axis of the birefringence emerging here can be set in a targeted fashion by a suitable arrangement of the radiation-induced defects. Here, studies carried out have shown that e.g. values of the delay or retardation (i.e. the difference in the optical path lengths for mutually orthogonal or perpendicular polarization states) of more than 10 nm per centimeter material path can be set with great accuracy. By way of example, if the working wavelength is approximately 193 nm, a delay of lambda/2 corresponds to approximately 96.5 nm and hence to a required material path of less than 9 cm, which can be provided by one or else more of the illustrated polarization-influencing optical elements 101.

The optical element(s) 101 can be one or more additional elements, specifically introduced into the optical system for generating the desired birefringence or polarization effect, or else optical elements or lens elements, which in any case are already present in the optical system (such as e.g. of the illumination device of a microlithographic projection exposure apparatus).

Figure 3:
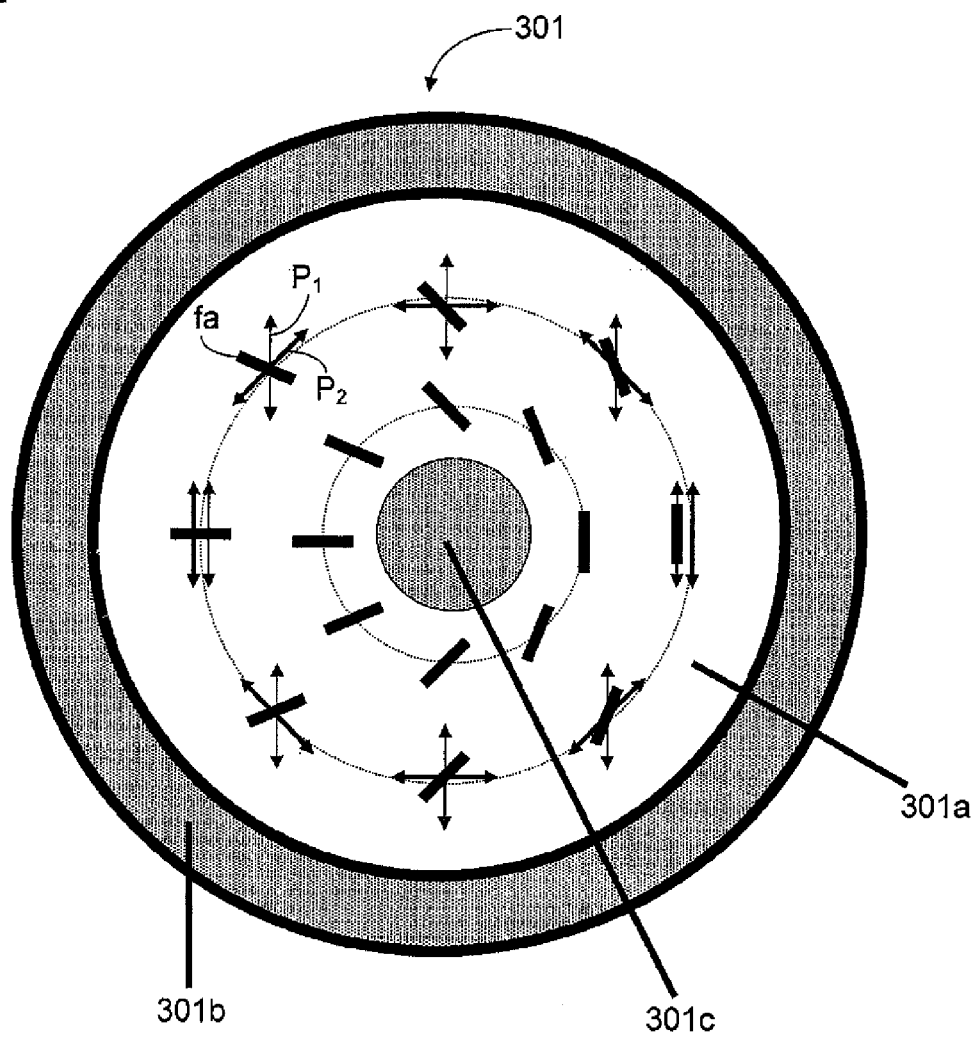
FIG. 3 shows a schematic illustration for explaining a further embodiment of a polarization-influencing optical element.

FIG. 3 shows a schematic illustration for explaining design and functionality of a polarization-influencing optical element 301 in accordance with a further embodiment of the invention. The embodiment in accordance with FIG. 3 differs from that in accordance with FIG. 2 by virtue of the fact that the above-described radiation-induced defects are not only formed in an optically unused radially outer region 301b but additionally also in a radially inner region 301c, wherein the radially inner and radially outer regions are in respect of the optical system axis OA.

In further embodiments of the invention, the polarization-influencing optical arrangement can, in place of only a single polarization-influencing optical element with locally varying direction of the fast axis of the birefringence, also comprise a plurality of such polarization-influencing optical elements, which, in respect of the light propagation direction, can be arranged one behind the other (in particular, but not necessarily, directly in succession). Such an embodiment is advantageous in that the production is further simplified since each of the polarization-influencing optical elements in each case need only supply a smaller contribution to the birefringence obtained overall.

Figure 4:
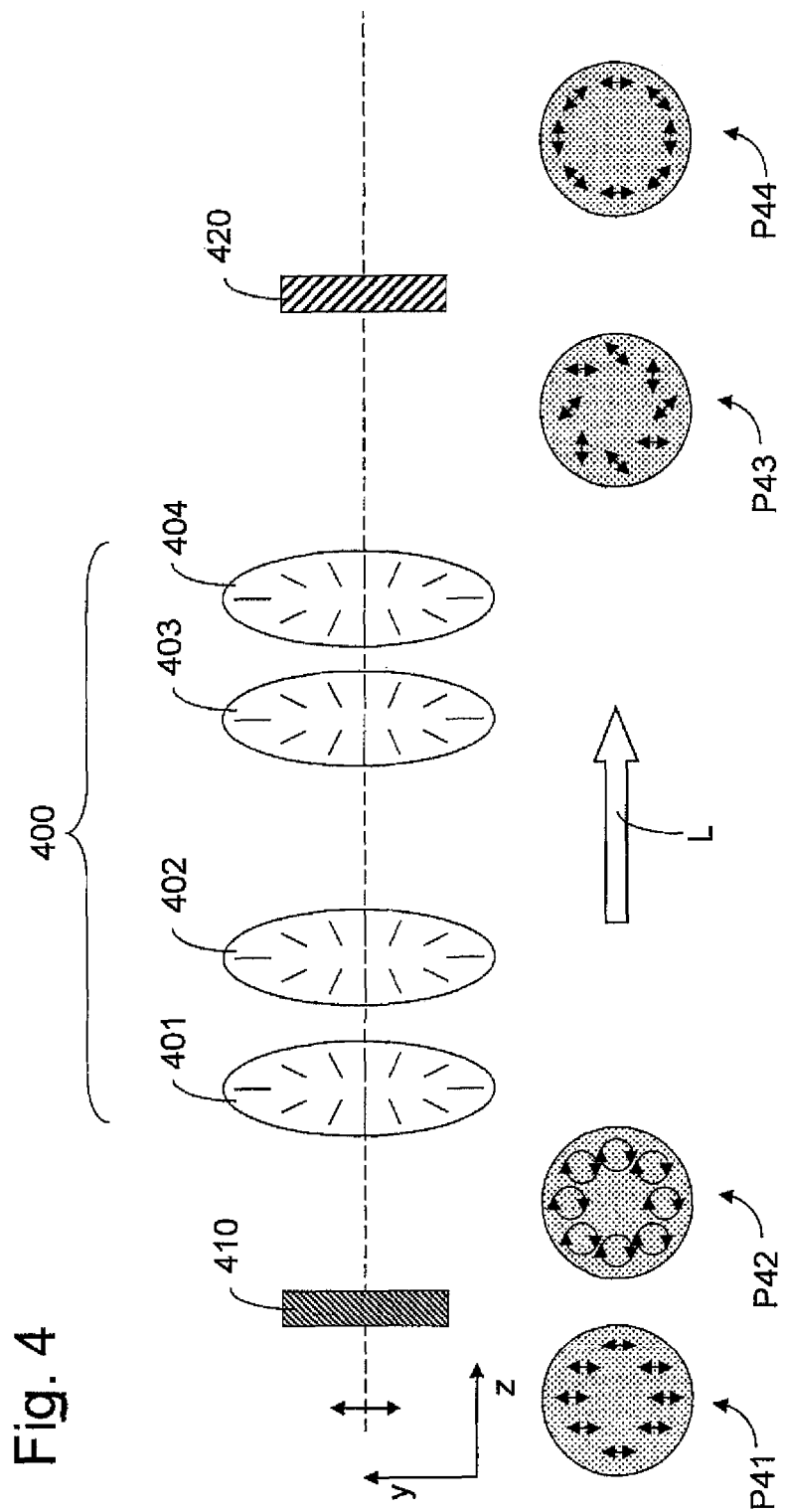
FIGS. 4-5 show schematic illustrations for explaining further exemplary embodiments of a polarization-influencing optical arrangement.

FIG. 4 shows, in a schematic illustration, an exemplary embodiment in which a polarization-influencing optical arrangement 400 according to the invention comprises four polarization-influencing optical elements 401-404, of which each, as described above, is linearly birefringent and embodied with a local variation of the fast axis of the birefringence. Additionally, in accordance with FIG. 4, a lambda/4 plate 410 is provided upstream of the arrangement 400 in the light propagation direction (denoted by the arrow "L") and a 45° rotator 420 is provided downstream of the arrangement 400 in the light propagation direction. The lambda/4 plate 410 can be made in any way from a suitable optically uniaxial crystal material such as e.g. magnesium fluoride ($MgF_2$), sapphire ($Al_2O_3$) or else crystalline quartz with an alignment of the optical crystal axis perpendicular to the light propagation direction. The 45° rotator 420 can, in order to provide the desired polarization rotation about an angle of 45°, for example be made of optically active crystalline quartz with an alignment of the optical crystal axis parallel to the light propagation direction and with a suitable thickness.

As indicated in the lower part of the image in FIG. 4, the above-described arrangement of the individual components leads to an initially constant linear input polarization distribution P41 being converted into a polarization distribution P42 with constant circular polarization as a result of the lambda/4 plate 410. The individual polarization-influencing optical elements 401-404 of the arrangement 400 each have a radial distribution of the fast axis of the birefringence, which leads to a polarization distribution P43 being obtained after passing through the arrangement 400, which polarization distribution still is rotated about an angle of 45° relative to the ultimately desired tangential polarization distribution P44, and so the ultimately desired tangential polarization distribution P44 is only produced by the 45° rotator 420.

The fact that, as a result of the additional use of the lambda/4 plate 410 and of the 45° rotator 420, the distribution of the fast axis of the birefringence in the elements 401-404 respectively is a radial distribution results in the fact that (unlike in the case of, for example, the distribution of the fast axis of the birefringence in example of FIG. 1) the relevant spatial distribution of the fast axis of the birefringence can also be generated by external pressure (e.g. by using piezoelectric elements). However, naturally, it is also possible to apply the generation of radiation-induced defects, analogously to the exemplary embodiment described above on the basis of FIG. 1.

Figure 5:
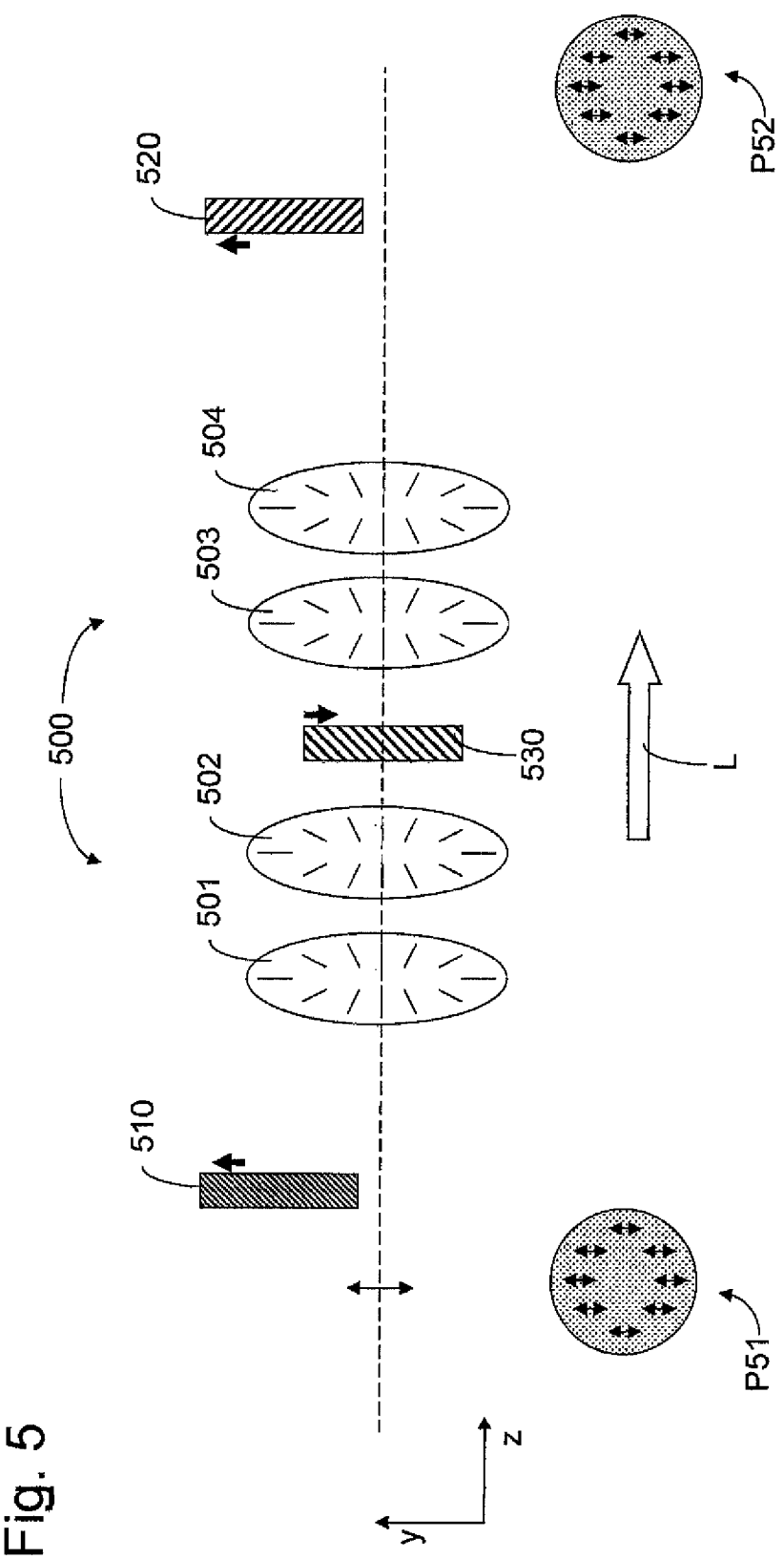

FIG. 5 shows, in a schematic illustration, a further embodiment of the invention. The latter distinguishes itself from the one in FIG. 4 in particular by virtue of the fact that a 90° rotator 530 is provided as a further component, wherein this 90° rotator 530 may, in particular, (without the invention being restricted thereto) be arranged between successive polarization-influencing optical elements 502, 503 of the polarization-influencing optical arrangement 500.

Moreover, as indicated by the plotted arrows, both the 90° rotator 530 and the components present analogously to FIG. 4, i.e. the lambda/4 plate 510 and the 45° rotator 520, can, in accordance with FIG. 5, be moved respectively independently of one another between a position outside of the beam path and position within the optical beam path. As indicated in the lower part of FIG. 5, a switch can, as a result of this, more particularly occur to the effect that the ultimately generated output polarization distribution is not a tangential polarization distribution, but once again a constant linear polarization distribution P52, namely by virtue of only the 90° rotator 530 being placed in the optical beam path. In this case, the birefringence effect of the elements 501, 502 situated upstream of the 90° rotator 530 in the light propagation direction is completely compensated for by the elements 503 and 504 situated downstream of the 90° rotator 530 in the light propagation direction (under the assumption of the overall birefringence contributions of, on the one hand, the elements 501, 502 corresponding to, on the other hand, the contributions of the elements 503, 504 in terms of the absolute value) such that, ultimately, the constant linear polarization distribution P52, corresponding to the original polarization distribution P51, is obtained. Moreover, by moving the 90° rotator 530 into a position outside of the optical beam path and respectively placing the lambda/4 plate 510 and the 45° rotator 520 into positions within the optical beam path, it is possible to realize the generation of a tangential output polarization distribution, which has already been described with respect to FIG. 4. Hence, as a result, it is possible in the exemplary embodiment of FIG. 5 to switch flexibly between a tangential and a constant linear output polarization distribution.

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the appended patent claims and the equivalents thereof.

The invention claimed is:

1. An optical system having an optical system axis, the optical system comprising:
   a polarization-influencing optical arrangement comprising at least one polarization-influencing optical element having a monolithic design and linear birefringence,
   wherein:
      lambda is a working wavelength of the optical system;
      an overall absolute value of birefringence of all of the at least one polarization-influencing optical element deviates by at most ±15% from lambda/2;
      a direction of a fast axis of the birefringence of the at least one polarization-influencing optical element varies in a plane perpendicular to the optical system axis;
      a distribution of the fast axis of the birefringence of the at least one polarization-influencing optical element is due to radiation-induced defects situated in at least one optically unused region of the at least one polarization-influencing optical element;
      the optically unused region of the at least one polarization-influencing optical element has an annular geometry; and
      the optical system is a microlithographic optical system.

2. The optical system of claim 1, wherein the overall absolute value of the birefringence of all the at least one polarization-influencing optical element deviates by at most ±10% from lambda/2.

3. The optical system of claim 1, wherein, during the operation of the optical system, the polarization-influencing optical arrangement converts a constant linear input polarization distribution of light incident on the arrangement into a distribution selected from the group consisting of an at least approximately tangential distribution, an at least approximately radial distribution, and a mixed radial/tangential output polarization distribution.

4. The optical system of claim 1, wherein the distribution of the fast axis of the birefringence of the at least one polarization-influencing optical element is due to radiation-induced defects in: a) a first radially inner region with respect to the optical system axis; and b) a second radially outer region with respect to the optical system axis.

5. The optical system of claim 1, wherein the at least one polarization-influencing optical element has a plane-parallel geometry.

6. The optical system of claim 1, wherein the at least one polarization-influencing optical element comprises an amorphous material.

7. The optical system of claim 1, wherein the at least one polarization-influencing optical element comprises quartz glass ($SiO_2$).

8. The optical system of claim 1, further comprising a lambda/4 plate upstream of the polarization-influencing optical arrangement along a direction of light propagation through the optical system during use of the optical system.

9. The optical system of claim 1, further comprising a rotator downstream of the at least one polarization-influencing optical arrangement along a direction of light propagation through the optical system during use of the optical system, wherein during use of the optical system the rotator causes a rotation of the polarization direction of incident light about a polarization rotation angle of 45°.

10. The optical system of claim 1, further comprising a rotator, wherein during use of the optical system the rotator causes a rotation of the polarization direction of incident light about a polarization rotation angle of 90°.

11. The optical system of claim 10, wherein the polarization-influencing optical arrangement comprises a plurality of polarization-influencing optical elements in succession along a direction of light propagation through the optical system during use of the optical system.

12. The optical system of claim 11, wherein at least one of the polarization-influencing optical elements is both upstream of the rotator along the direction and downstream of the rotator along the direction.

13. The optical system of claim 10, wherein during use of the optical system a system retardation generated in the optical system upstream of the rotator along the direction is at least partly compensated for by a system retardation generated in the optical system downstream of the rotator along the direction.

14. The optical system of claim 1, further comprising an actuator device configured to independently move an element of the optical system.

15. The optical system of claim 14, wherein the element comprises a member selected from the group consisting of a lambda/4 plate, a 45° rotator and a 90° rotator.

16. The optical system of claim 14, further comprising a lambda/4 plate, a 45° rotator and a 90° rotator, wherein:
the actuator device is configured to independently move the lambda/4 plate from inside an optical beam path of the optical system to outside the optical beam path of the optical system;
the actuator device is configured to independently move the 45° rotator from inside the optical beam path of the optical system to outside the optical beam path of the optical system; and
the actuator device is configured to independently move the 90° rotator from inside the optical beam path of the optical system to outside the optical beam path of the optical system.

17. The optical system of claim 1, wherein the polarization-influencing optical arrangement comprises a plurality of polarization-influencing optical elements in succession along a direction of light propagation through the optical system during use of the optical system.

18. An apparatus, comprising:
an illumination device; and
a projection lens,
wherein:
the apparatus is a microlithographic projection exposure apparatus; and
the illumination device comprises an optical system according to claim, and/or the projection lens comprises an optical system according to claim 1.

19. A method of using a projection exposure apparatus comprising an illumination system and a projection optical unit, the method comprising:
using the illumination system to illuminate at least a part of reticle; and
using the projection optical unit to project at least part of the illumination part of the reticle onto a wafer,
wherein the illumination system comprises an optical system according to claim 1.

20. An optical system having an optical system axis, the optical system comprising:
a polarization-influencing optical arrangement comprising at least one polarization-influencing optical element having a monolithic design and linear birefringence,
wherein:
a direction of a fast axis of the birefringence of the at least one polarization-influencing optical element varies in a plane perpendicular to the optical system axis;
a distribution of the fast axis of the birefringence of the at least one polarization-influencing optical element is due to radiation-induced defects situated in at least one optically unused region of the at least one polarization-influencing optical element;
the optically unused region of the at least one polarization-influencing optical element has an annular geometry;
during use of the optical system, the at least one polarization-influencing optical element converts a constant linear input polarization distribution of light incident on the polarization-influencing optical arrangement into a distribution selected from the group consisting of an at least approximately tangential distribution, an at least approximately radial distribution, and a mixed radial/tangential output polarization distribution; and
the optical system is a microlithographic optical system.

21. An optical system having an optical system axis, the optical system comprising:
a polarization-influencing optical arrangement comprising at least one polarization-influencing optical element having a monolithic design and linear birefringence,
wherein:
an absolute value of birefringence of all of the at least one polarization-influencing optical element deviates by at most ±15% from a constant value;
a direction of a fast axis of the birefringence of the at least one polarization-influencing optical element varies in a plane perpendicular to the optical system axis;
a distribution of the fast axis of the birefringence of the at least one polarization-influencing optical element is due to radiation-induced defects situated in at least one optically unused region of the at least one polarization-influencing optical element;

the optically unused region of the at least one polarization-influencing optical element has an annular geometry; and the optical system is a microlithographic optical system.

* * * * *